United States Patent [19]

Hilal

[11] Patent Number: 4,954,727

[45] Date of Patent: Sep. 4, 1990

[54] HYBRID TRANSFORMER CURRENT ZERO SWITCH

[75] Inventor: Mohamed A. Hilal, Madison, Wis.

[73] Assignee: General Dynamics Corp., Space Systems Division, San Diego, Calif.

[21] Appl. No.: 227,974

[22] Filed: Aug. 1, 1988

[51] Int. Cl.⁵ ............................................... H02B 1/24
[52] U.S. Cl. ..................................... 307/112; 505/870
[58] Field of Search ................ 307/112; 505/870, 869, 505/856

[56] References Cited

U.S. PATENT DOCUMENTS

| | | | |
|---|---|---|---|
| 2,987,631 | 6/1961 | Park, Jr. | 505/870 X |
| 3,243,654 | 3/1966 | Wright | 505/870 X |
| 3,701,906 | 10/1972 | Denel et al. | 505/870 X |

Primary Examiner—William M. Shoop, Jr.
Assistant Examiner—Sharon D. Logan
Attorney, Agent, or Firm—John R. Duncan; Frank D. Gilliam

[57] ABSTRACT

A pulsed transformer having a superconducting primary winding and a normal conducting secondary winding. The secondary winding is connected across a load. One side of the secondary winding has a switch in series to the load. A high energy storage inductor is connected in parallel across the switch. With the switch closed and the primary winding and storage inductor charged to their maximum capacity, a high level of current now flows through the switch. The primary is then caused to go into its normal conducting mode collapsing the primary field which induces current into the secondary winding. As the secondary winding current increases the high level of current normally flowing through the switch decreases to substantially zero. When the switch current reaches substantially zero, the switch can be opened without damage thereto releasing the high energy from the storage inductor into the load. The switch primary winding can be constructed from a high temperature superconductor for improved performance.

6 Claims, 1 Drawing Sheet

HYBRID TRANSFORMER CURRENT ZERO SWITCH

BACKGROUND OF THE INVENTION

The invention relates to high power pulse transformer for microwave generators, advanced propulsion systems, eletromagnetic launches, etc. requiring energies on the order of 0.27 Mega Joules (MJ) to be supplied within a few milliseconds and more particularly to the switching of these pulses on and off.

Two types of switches are presently used for this application, namely, the direct interrupt and current zero switches. These switches suffer because of limitation from repetitive use. The direct interrupt switches suffer from severe damage of the electrodes and limited efficiency due to unavoidable energy losses during their commutation phase. They cannot be used respectively without further development advances. Current-zero switches now under development utilize capacitors that lead to bulky, inefficient switches wheras the proposed current zero switch has the potential of 100% efficiency.

There has not been a completely successful zero-current switch for the purpose above discussed until the emergence of the instant invention.

SUMMARY OF THE INVENTION

The instant invention utilizes the transition of a superconducting, zero resistance transformer primary coil to the normal resistive state. Any resistive voltage (IR) generated within the primary windings following normal transition is cancelled. This leads to a rapid current transfer to the secondary coil windings. The primary windings internal resistive voltage is locally cancelled by the inductive voltage in the primary coil, which leads to zero terminal voltage as well as a low net internal voltage. This concept is fully explained ina copending patent application having Serial No. 07/061761 filed on Jun. 15, 1987 and assigned to the same assigned as the instant application.

The switching concept of this invention utilizes the transition of a super conducting, substantially zero resistance coil to the normal resistive state.

In the present invention, like the aforementioned application, the secondary coil is connected across a load which utilizes the high energy pulsed power. One of the ends of the secondary coil is connected in series through a switch. The switch has a high energy storage coil in parallel thereacross.

In operation, the current in the transformer primary coil is zero during the quiescent mode. When pulsed power transfer is required, the superconducting primary and high energy storage coil are charged to about 0.27 MJ with the current through the high energy storage coil flowing through the closed parallel switch. The current in the transformer primary coil is given an immediate increase driving the primary normal. The primary field therefore collapses in a fraction of a millisecond inducing current in the secondary coil. As the current increases in the secondary circuit, the current through the switch in parallel with the high energy storage coil decreases and therefore the switch can be opened when substantially zero current through the switch is achieved. The opening of the switch, when the current flow in the primary circuit is substantially equal to the opposing current flow through the high energy storage coil releases the stored energy from the high energy storage coil into the load.

The principal object of this invention is to provide a means for the switching of high energy from an energy source into a load.

Another object of this invention is to transfer energy from a source to a load with minimum loss.

Still another object of this invention is to reuse the switch of the invention an indefinite number of switching sequences.

The manner of accomplishment of these and other objects and the presence of other advantages of the present invention will become apparent as the description proceeds with reference to the drawing FIGS. in which:

DESCRIPTIONS OF THE DRAWINGS FIGURES

Figure 1:
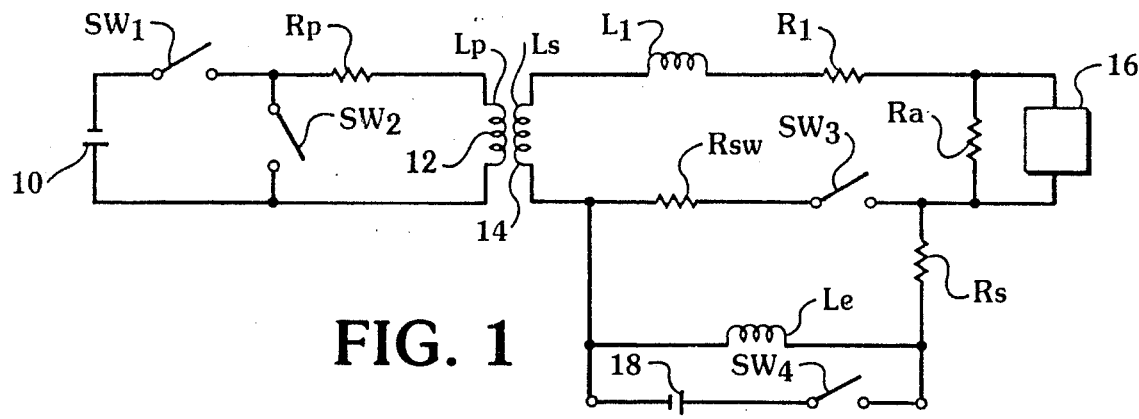
FIG. 1 depicts a schematic circuit showing of the hybrid transformer current-zero switch in a quiescent mode.

The construction of the transformer is fully discussed in the aforementioned copending Patent Application Serial No. 07/061761 hereinbefore referenced and therefore will not be further discussed herein.

Referring now to the various drawing Figures which generally depict a schematic showing of a circuit employing the present invention in various operational configurations.

A power source 10 is utilized for charging the transformers primary winding 12. In series with one side of the transformer primary and the positive potential of the power source 10 is a make/break switch SW1. A make/break switch SW2 is wired in parallel with the power source 10 and the primary winding 12. Rp represents the internal resistance of the primary winding 12.

The secondary winding 14 is connected across a load 16. In series with one side of the secondary winding 14 and the load 16 is a make/break switch SW3. Parallel across switch SW3 is a high energy storage inductor L. L1 and R1 shown in series between the other side of the secondary winding 14 and the load 16 represent the inductance and the resistance of the connection respectively. A high energy power source 18 and a series make/break switch SW4 is connected is parallel with Le and SW3.

Rsw represents the internal resistance of switch SW3. Ra represents armature resistance and Rs represents the internal resistance of the secondary winding L4.

Lp and Ls represent the inductance of the primary and secondary windings 12 and 14 reactively.

Referring now specifically to the circuit of FIG. 1, the above described circuit is shown in its quiescent mode. In this mode all switches are open.

Figure 2:
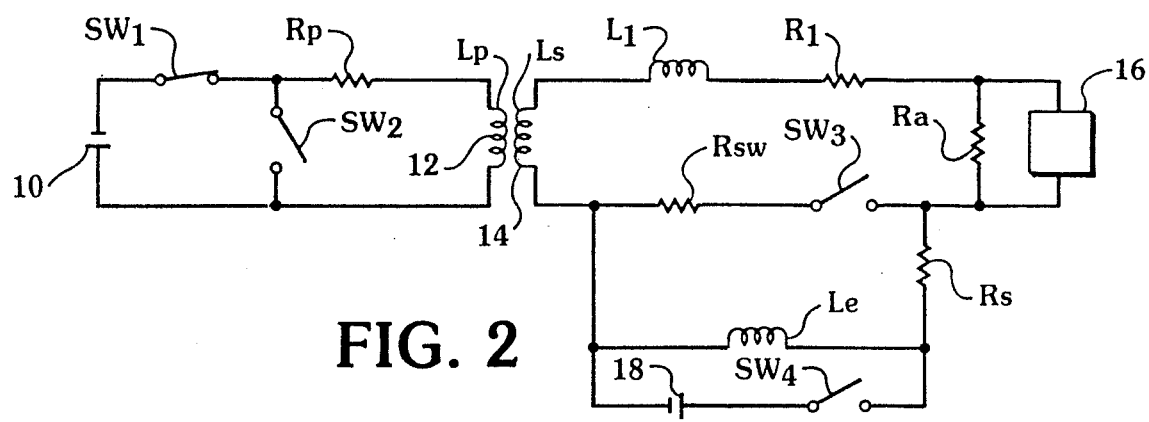
FIG. 2 depicts the schematic circuit of FIG. 1 in the charge mode.

Referring now specifically to the circuit of FIG. 2, the above described circuit of FIG. 1 is in the primary windings charge mode. The switch SW1 is closed and the primary winding 12 in its superconducting mode is charged to about 0.27 MJ of energy from power source 10.

Figure 3:
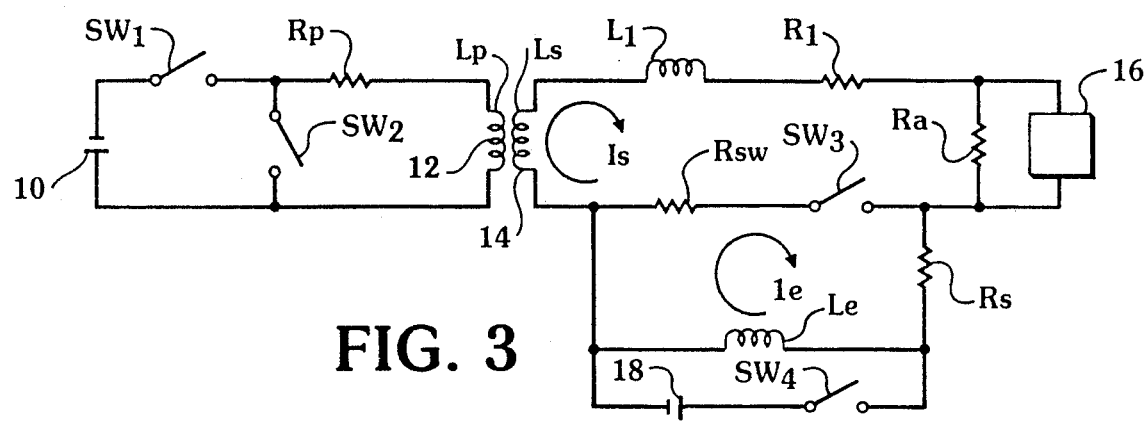
FIG. 3 depicts the schematic circuit of FIG. 1 in the process of the primary transition from superconducting to normal mode.

Referring now specifically to FIG. 3, switch SW4 is closed and the storage inductor Le is then charged from power source 18. Switch SW3 is then closed causing the current to go to zero in SW4. The current in the primary is then given an intermediate increase by the closing of SW2 and the opening of SW1 thus driving the primary winding normal. The circuit in the primary winding is limited to a value less than 2,500 amps, which poses no difficulty in closing and openings of switches SW2 and SW1 respectively. The primary field therefore collapses in a fraction of a millisecond inducing current in the secondary.

Figure 4:
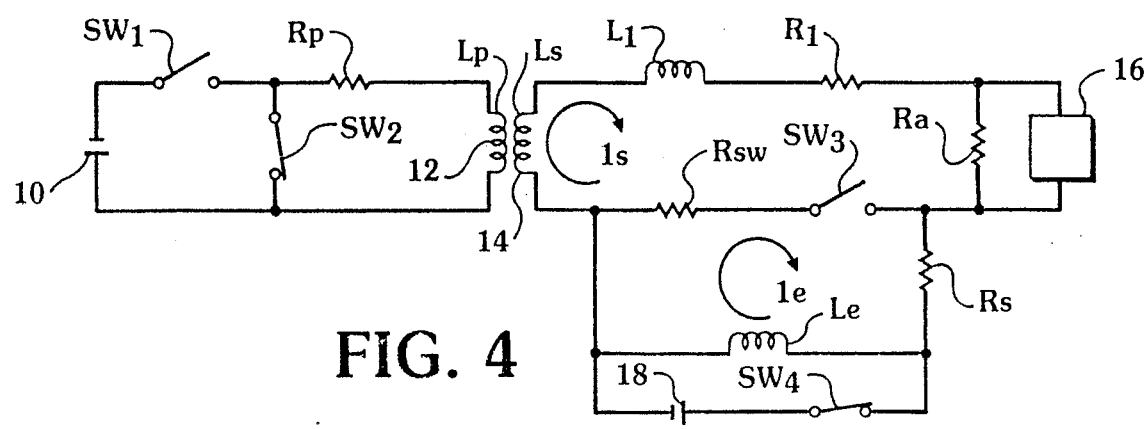
FIG. 4 depicts the schematic circuit of FIG. 1 in the energy transfer mode.

Referring now specifically to the circuit of FIG. 4, the above described circuit of FIG. 1 is shown in the inductor Le storage mode. As the Current in the secondary winding circuit increases due to the collapse of the primary winding, the current through switch SW3 decreases as the current in the secondary winding (Is) and the current in Le (Ie) reach equilibrium, see the current flow direction arrows for Is and Ie, the switch SW3 can now be opened as shown in FIG. 4. When SW3 is opened, the stored energy in Le is transferred to the load 16.

The use of an alternate operational sequence may result in still lower switch losses by discharging the primary winding 12 to zero current prior to the opening of SW1. This alone may induce reverse current in switch SW3. This operational mode can be utilized since the current decays back to zero in SW3 as a result of supplying power to the load 16. The reverse current duration period is expected to be longer when compared to the forward current duration period, thus allowing better synchronous operation.

The switch operation and characteristics are illustrated mathematically as follows: As the primary winding is charged, the applied voltage is given by:

$$V = L_p \frac{dI_p}{dt} + I_p R_p$$

Where Lp, Ip, and Rp are the primary coil inductance, current, and resistance respectfully, while the primary is operating in superconducting state, the coil resistance Rp is negligible. When the primary coil temperature increases, the current is shared with the normal substrate of the conductor. Neglecting current diffusion, and current sharing process as the critical current is reached, $$V = L_p \frac{dI_p}{dt} + I_p R_p + M \frac{dI_s}{dt}$$

Where M is the mutual inductance between the primary and secondary circuits and Is is the secondary current. This equation is coupled to the equation for the secondary circuit, given by:

$$(L_e + L_r + L_{sw}) \frac{dI_s}{dt} - L_{sw} \frac{dI_e}{dt} + M \frac{dI_p}{dt} + I_s (R_a + R_q + R_{sw} + R_e) = 0$$

Where Le, Lr and Lsw are secondary, the leads, and the switch self inductances, respectively. Is is the secondary current, Ie is the energy storage inductor current. Ra, Rq, Rsw, and Re are the load, the secondary, the switch, and the leads resistance, respectively.

The current in the storage inductor Le is given by:

$$(L_e + L_{sw}) \frac{dI_e}{dt} - L_{sw} \frac{dI_s}{dt} + I_e (R_e + R_{sw}) - I_s R_{sw} = 0$$

The solution of the above equation gives switch characteristics.

It should be understood that any type switch switchable for the purpose intended could be used for SW1, SW2, SW3 and SW4. Preferably, these switches take the form of so called solid state switching devices which can be sequentially controlled by electronic means well known in the electronic power switching act.

The storage inductor Le may take the form of solenoidal or toroidal windings.

The arrows on the FIGS. 3 and 4 depict the direction of simultaneous current flow through the various secondary circuit branches.

The operation cycle frequency of the current-zero switch of the invention is determined by the primary power supply characteristics and the primary winding cool down time.

A cycle consists of charging and discharging of the transformer plus the time to recool the primary winding conductor. Analyses indicate that the primary winding charge time will be about 0.1 sec, the discharge time 0.2 milliseconds and the recool time between 0.03 and 0.35 seconds. This analyses indicates that a conservative approach produces a cycle frequency in the range of from 2Hz to 5Hz. Increase in the cycle frequency above this range is possible with high temperature superconductors requiring shorter recool time.

The foregoing description of the preferred embodiment of the invention has been presented for purposes of illustration and description. It is not intended to be exhaustive or to limit the invention to the precise form disclosed, and obviously many modifications and variations are possible in light of the above teachings. The embodiment was chosen and described in order to best explain the principles of the invention and its practical application to thereby enable others skilled in the art to best utilize the invention in various modifications as are suited to the particular use contemplated. It is intended that the scope of the invention be defined by the claims appended hereto.

What is claimed is:

1. A hybrid transformer current-zero switch, said transformer having a primary winding formed from a conductor means which has minimal resistance when in a superconducting first state and substantially uniform resistance along its length in a normal conducting second state, a load, a normal conducting secondary winding one end of which is connected directly to said load, means for establishing said primary winding in said first state, first power means for charging said primary winding while in said first state and means for changing said primary winding from said first state to said second state causing the charge in said primary winding to be transferred to said secondary wincing and said load comprising:

a series parallel circuit connected between the other end normal conducting secondary winding and said load said series parallel circuit comprising a switch in parallel with storage inductor; and a second power supply for selectively charging said storage inductor, when said storage inductor is fully charged and said switch is closed just prior to said primary winding changing from said first to said second state high current flows through said switch and when said charge on said primary winding is transferred to said secondary winding current flows in said secondary winding causing said high current flow through said switch to approach zero whereby said switch can be opened without damage thereto thereby transferring the stored energy from said storage inductor into said load.

2. The invention as defined in claim 1 wherein said switch is a solid state device.

3. The invention as defined in claim 1 wherein the frequency of operation of said switch is between 2 and 5 hz.

4. The invention as defined in claim 1 wherein said storage conductor comprises a solenoidal winding.

5. The invention as defined in claim 1 wherever said storage conductor comprises a toroidal winding.

6. The invention as defined in claim 1 wherein as the temperature of the superconducting primary increases the frequency of operation of the switch increases.

* * * * *